(12) United States Patent
Yoshino et al.

(10) Patent No.: US 6,257,224 B1
(45) Date of Patent: *Jul. 10, 2001

(54) PROCESS FOR WORKING A PREFORM MADE OF AN OXIDE SINGLE CRYSTAL, AND A PROCESS FOR PRODUCING FUNCTIONAL DEVICES

(75) Inventors: Takashi Yoshino; Kenji Kato, both of Ama-Gun; Minoru Imaeda, Nagoya, all of (JP)

(73) Assignee: NGK Insulators, Ltd., Nagoya (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/031,566

(22) Filed: Feb. 26, 1998

(30) Foreign Application Priority Data

Mar. 4, 1997 (JP) .................................................. 9-048834
Aug. 15, 1997 (JP) .................................................. 9-220320

(51) Int. Cl.[7] .................................................. B28D 1/04
(52) U.S. Cl. .................. 125/13.01; 125/20; 125/901; 225/2
(58) Field of Search .................. 125/13.01, 20, 125/901, 23.01; 225/93.5, 96, 2; 219/121.68, 121.69; 451/41

(56) References Cited

U.S. PATENT DOCUMENTS

| | | |
|---|---|---|
| 3,112,850 | 12/1963 | Garibotti . |
| 3,247,576 * | 4/1966 | Dill et al. ............................ 125/23.01 |
| 3,257,626 * | 6/1966 | Marinace et al. .................. 125/23.01 |
| 4,227,348 * | 10/1980 | Demers .................................. 451/41 |
| 5,776,220 * | 7/1998 | Allaire et al. ............................. 225/2 |
| 5,968,382 * | 10/1999 | Matsumoto et al. ................ 225/93.5 |

FOREIGN PATENT DOCUMENTS

| | | |
|---|---|---|
| 28 26 110 | 12/1978 | (DE) . |
| 249 797 A1 | 9/1987 | (DE) . |
| 0 624 423 | 11/1994 | (EP) . |
| 60-170314 | 9/1985 | (JP) . |
| 288714 * | 11/1988 | (JP) ........................................ 125/20 |
| 1-69304 | 3/1989 | (JP) . |
| 3-252384 | 11/1991 | (JP) . |
| 61-251132 | 11/1996 | (JP) . |

OTHER PUBLICATIONS

Patent Abstracts of Japan vol. 007, No. 118 (C–167), May 21, 1983 & JP 58 036939 A (Tokyo Shibaura Denki KK), Mar. 4, 1983.

Patent Abstracts of Japan vol. 007, No. 129 (E–179), Jun. 4, 1983 & JP 58 044739 A (Tokyo Shibaura Denki KK), Mar. 15, 1983.

R. Lefevre et al.: "Laser processed miniature LiTaO3 resonators and monolithic filters with their integrated holder", International Conference On Frequency Control and Synthesis, Guildford, Surrey, UK, Apr. 8–10, 1987, pp. 37–43 XP002067147.

* cited by examiner

Primary Examiner—Joseph J. Hail, III
Assistant Examiner—George Nguyen
(74) Attorney, Agent, or Firm—Burr & Brown

(57) ABSTRACT

A process for dicing a preform made of an oxide single crystal into cut pieces each having a given shape, includes the steps of removing molecules of the oxide single crystal through dissociation and evaporation with an optochemical reaction under irradiation of a laser beam upon the preform, thereby forming grooves on the preform, and then cleaving the preform along the groove.

15 Claims, 3 Drawing Sheets

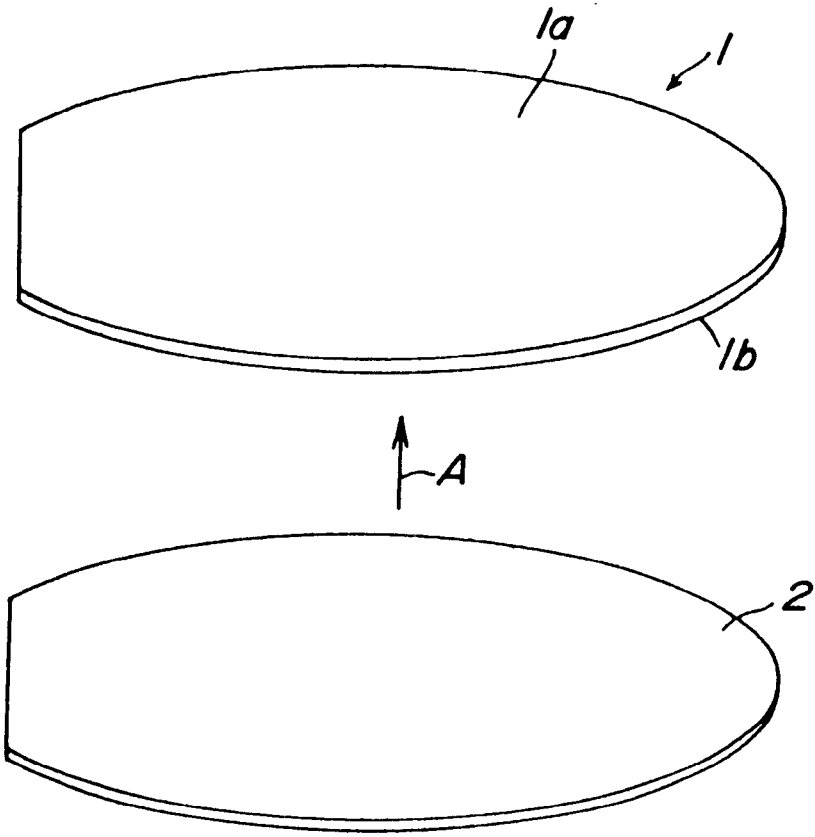
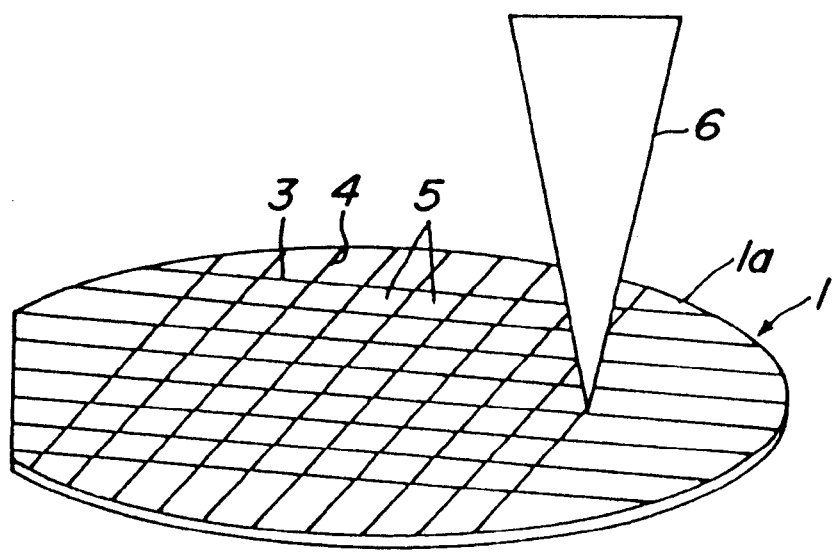

PROCESS FOR WORKING A PREFORM MADE OF AN OXIDE SINGLE CRYSTAL, AND A PROCESS FOR PRODUCING FUNCTIONAL DEVICES

BACKGROUND OF THE INVENTION (1) Field of the Invention

The present invention relates to a process for dicing a preform made of an oxide single crystal and a process for producing functional devices.

(2) Related Art Statement

The traveling wave optical modulator in which an oxide single crystal such as lithium niobate ($LiNbO_3$), lithium tantalate ($LiTaO_3$) or quartz is applied to an optical waveguide has excellent characteristics, and can realize a high speed modulation at a high efficiency. Lithium niobate and lithium tantalate are excellent as ferroelectric materials, and are advantageous in that they possess high electro-optic coefficients, and can control light within a short optical path. Further, research have started to form SHG elements (second harmonic generation elements) on oxide single crystal substrates.

On the other hand, in addition to such optical devices, research have been also begun to form piezoelectric devices such as piezoelectric oscillators from such single crystals.

n both optical devices and piezoelectric devices it is beneficial that a number of devices be formed on a surface of a wafer, and that the resulting wafer is then diced into a number of individual devices.

Heretofore, a cutting method using an outer peripheral cutting type, extremely thin grinding stone has been known to dice the oxide single crystal wafers ("Latest Cutting Technique Handbook" edited by Latest Cutting Technique Handbook Editing Committee, publisher: Industrial Technical Service Center Co., Ltd., pp 70–73). According to this method, fine diamond abrasive grains and a 20–40 $\mu$m and 20–40 thick resinoid or metal-bonded grinding stone are used. According to this method, if a grinding stone having a small grit size is used, extremely high precision, machining can be performed and the state of cut surfaces is very good.

However, when dicing the oxide single crystal wafers according to this method the following problems arise.

(1) In order to prevent rise in temperature with frictional heat during cutting, the wafer needs to be cut while cooling water is being splashed onto the wafer. Since the devices are contaminated by this cooling water, a post washing step is required.

(2) Unless a considerably high mechanical accuracy is exercised during a feed stage and with respect to a spindle for moving the wafer, chipping or cracking occurs in cut pieces during only slight movement of the grinding stone. Moreover, the wafer needs to be fixed at a considerably high accuracy.

(3) Since the grinding stone has already been worn, the stone has a small grit size and, the grinding stone needs to be adjusted due to the change in the shape of the cutting surface of the grinding stone so that the depth of a groove formed may be identical during each machining.

(4) In addition to the above problems, a pre-step such as surface-coating and steps of peeling the surface coating on the wafer and washing the cut pieces, even if the cutting speed is highly raised. Consequently, a total time required for the dicing becomes longer. Furthermore, heating is necessary on surface-coating, resin-fixing and drying after the washing. Since the oxide single crystal is weak against heat impact, a very careful attention must be paid during the heat treatment and to prevent uneven characteristics of the resulting products.

In order to avoid the above problems, the present inventors cut oxide single crystal wafers through cleavage by way of experiments. Ionic crystals such as LiF and NaCl can be cleaved and cut along their specific crystalline faces by hitting them with a knife edge ("Latest Cutting Technique Handbook" published by Industrial Technical Service Center Co., Ltd., pp 258–259). Further, a GaAs single crystal substrate and an InP single crystal substrate for semiconductor laser can be also cut by cleavage, and resonator mirrors can simultaneously produced. Since the cleaved surface of the crystal having good cleavage property is flat and smooth as viewed from the atomic level, it need not be optical polished.

However, the oxide single crystal is unlikely to be cleaved, so that it cannot be practically used.

With respect to the silicon wafer, a inscribe groove is formed on the silicone wafer by using a diamond cutter, and the wafer is cleaved along this inscribe groove. Such a method is used for glass, too.

However, it is more difficult to machine the oxide single crystals, for example as compared with silicon, and even if an inscribe line is formed on the surface of an oxide single crystal wafer and then the wafer is hit, the wafer is likely to be cracked in every direction rather than in a given direction from the inscribe groove. Consequently, the cut surface has many uneven portions. In addition, since the oxide single crystal is generally so hard that it may be difficult to form an inscribe line thereon, this method renders the wafer difficult to be cut, which increases the occurrance of unacceptable products and decreases the yield of the devices.

SUMMARY OF THE INVENTION

It is an object of the present invention to provide a new dry process for dicing a preform made of an oxide single crystal as well as a process for producing functional devices based on a new technique.

The present invention relates to a process for dicing a preform made of an oxide single crystal into cut workpieces each having a given shape, said process comprising the steps of removing molecules of the oxide single crystal through dissociation and evaporation with an optochemical reaction under irradiation of a laser beam upon the preform, thereby forming a groove on the preform, and then cleaving the preform along the groove.

The present invention also relates to a process for producing functional devices provided on cut pieces each made of an oxide single crystal and having a given shape, said process comprising the steps of forming the functional devices on a wafer at positions corresponding to locations of the cut pieces, removing molecules of the oxide single crystal through dissociation and evaporation with an optochemical reaction under irradiation of a laser beam upon the wafer, thereby forming such grooves on the preform as to surround the respective functional devices, and then cleaving the wafer along the grooves.

The present inventors discovered that if the groove is formed on the preform by removing molecules of the oxide single crystal through dissociation and evaporation with an optochemical reaction under irradiation of a laser beam upon the preform from the standpoint of dicing preforms such as various kinds of oxide single crystals such as wafers made of lithium niobate single crystal, the preform is easily cleaved along the groove with a good cleaved surface shape and a small rate of rejected products. The inventors reached the present invention based on this discovery.

Functional devices such as optical devices including traveling wave optical modulators or second harmonic generation elements or piezoelectric devices are formed on a preform such as a wafer, particularly made of an oxide single crystal, each device can be extremely easily produced at a high yield by the above dicing process in a dry state.

These and other objects, features and advantages of the invention will be appreciated upon the reading of the following description of the invention when taken in conjunction with the attached drawings, with the understanding that some modifications, variations and changes of the invention will be easily effected by the skilled person in the art to which the invention pertains.

BRIEF DESCRIPTION OF THE DRAWINGS

For a better understanding of the invention, reference is made to the attached drawings, wherein:

FIGS. 1(a) and 1(b) are a perspective view for illustrating a step in which an adhesive tape 2 is being attached to a rear surface 1b of a wafer 1, and a perspective view for illustrating a step in which grooves 3 and 4 are being formed on a front surface 1a of the wafer 1 by irradiating a laser beam 6 upon it, respectively;

DETAILED DESCRIPTION OF THE INVENTION

Figure 2:
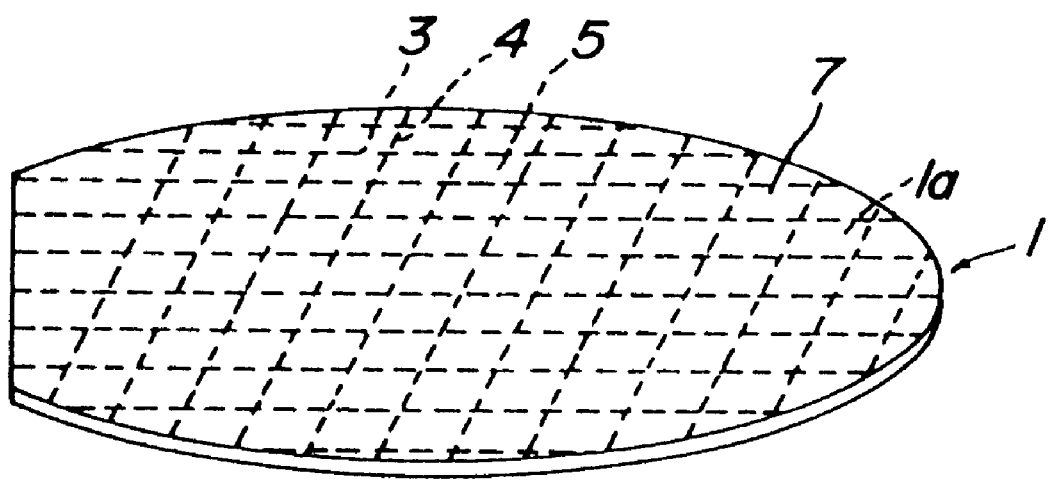
FIG. 2 is a perspective view of a wafer in which a resist film 7 is formed on the front surface 1a of the wafer 1 having the grooves 3 and 4 thereon.

The process for forming grooves by removing molecules of the oxide single crystal through dissociation and evaporation with an optochemical reaction under irradiation of a laser beam upon the preform will be explained.

The present inventors noted the so-called ablation technique utilized in finely working polymeric materials. Heretofore, completely no attempt has been made to apply the laser ablation technique to the formation of grooves for cleavage.

The laser ablation is a technique to remove molecules of a material to be worked, through dissociation and evaporation under irradiation of a laser beam upon the material, the laser beam having a wavelength equivalent to a bond energy between the molecule constituting the material. This is not a thermal processing, so that only a portion of the material upon the laser beam is irradiated can be worked, while no adverse effect is spread over the surrounding area. Thus, working can be effected at a high precision by this laser ablation.

If this laser ablation technique is applied to an oxide single crystal, for example a single crystal of lithium niobate having a bond energy of 8 to 9 eV, the oxide single crystal must be able to be simply ablated with a laser beam having an energy higher than the bond energy. However, since the energy of 8 eV is converted to about 150 nm, this is not practical in that the laser beam having a wavelength of not longer than 150 nm is extremely special.

The present inventors discovered that a preform can be cut by multiphoton absorption through condensing a laser beam having a wavelength near that an absorption edge of an oxide single crystal upon the surface of the preform at a high density rather than by the simple laser ablation. At this time, since the preform of the oxide single crystal is slightly thermally affected in cutting the preform, this process called a quasi-thermal working.

More specifically, it is preferably to set a difference in wavelength between the absorption edge of the oxide single crystal constituting the preform and the laser beam at not more than 100 nm, desirably at not more than 50 nm.

By using the above process, grooves can be formed on preforms made of lithium niobate, lithium tantalate, lithium niobate-lithium tantalate solid solution, $K_3Li_2Nb_5O_{15}$, $La_3Ga_5Si_{14}$ or aluminum oxide by working with laser beam having a wavelength of 200–300 nm.

The depth of each of the grooves formed on the preform is preferably not less than 0.1 mm.

For example, fourth harmonic waves such as Excimer laser and Nd-YAG laser may be preferably used as the laser beam for working the preform.

The Excimer laser is a oscillating laser in which UV pulses are repeated, and is formed by extracting ultraviolet rays generated from a gaseous compound such as ArF (wavelength: 193 nm), KrF (wavelength: 248 nm) or XeCl (wavelength: 308 nm) in the state that the orientation of the beam is aligned by an optical resonator.

It is reported that the ablation working using Excimer laser is used for boring a polyimide material or the like for fine working, and that Excimer ablation can form fine holes having fine holes each having a good shape. As a literature regarding an applied technology of the Excimer laser, a special theme "Excimer laser that has come to a practically applicable age" in "O plus E", pp. 64–108, November 1995 may be recited.

On the other hand, the inventors tried to form grooves on a preform made of an oxide single crystal by thermally melting the preform through irradiating a laser beam having a relatively long wavelength, for example, $CO_2$ laser beam (10.6 μm) upon the preform. In this case, the preform locally undergoes is rapid heating and cooling at a portion of the preform upon which the laser beam is irradiated. However, the oxide single crystals, particularly oxide piezoelectric oxide single crystals such as lithium niobate and lithium tantalate are very weak against heat impact. For, if temperature rapidly changes inside the piezoelectric single crystal, current collecting rapidly occurs at a place around a portion of the single crystal where the temperature changes, with the result that the single crystal is inevitably cracked there. For example, if $CO_2$ laser beam is irradiated upon the preform, a number of cracks occur in the preform beyond control, seemingly based on the current collecting. This makes it difficult to form grooves fit for cleavage of the preform.

A so-called batch-exposure type irradiator and a so-called multiple reflection type irradiator are known as the laser beam irradiator. The multiple reflection type irradiator is characterized in that a light-utilizing percentage is high even if its numerical aperture is small. In the present invention, it is more preferable to use the multiple reflection type irradiator.

So-called spot scanning, batch-transferring and slit scanning may be recited as a scanning process for working the oxide single crystal with the laser beam.

Figure 3:
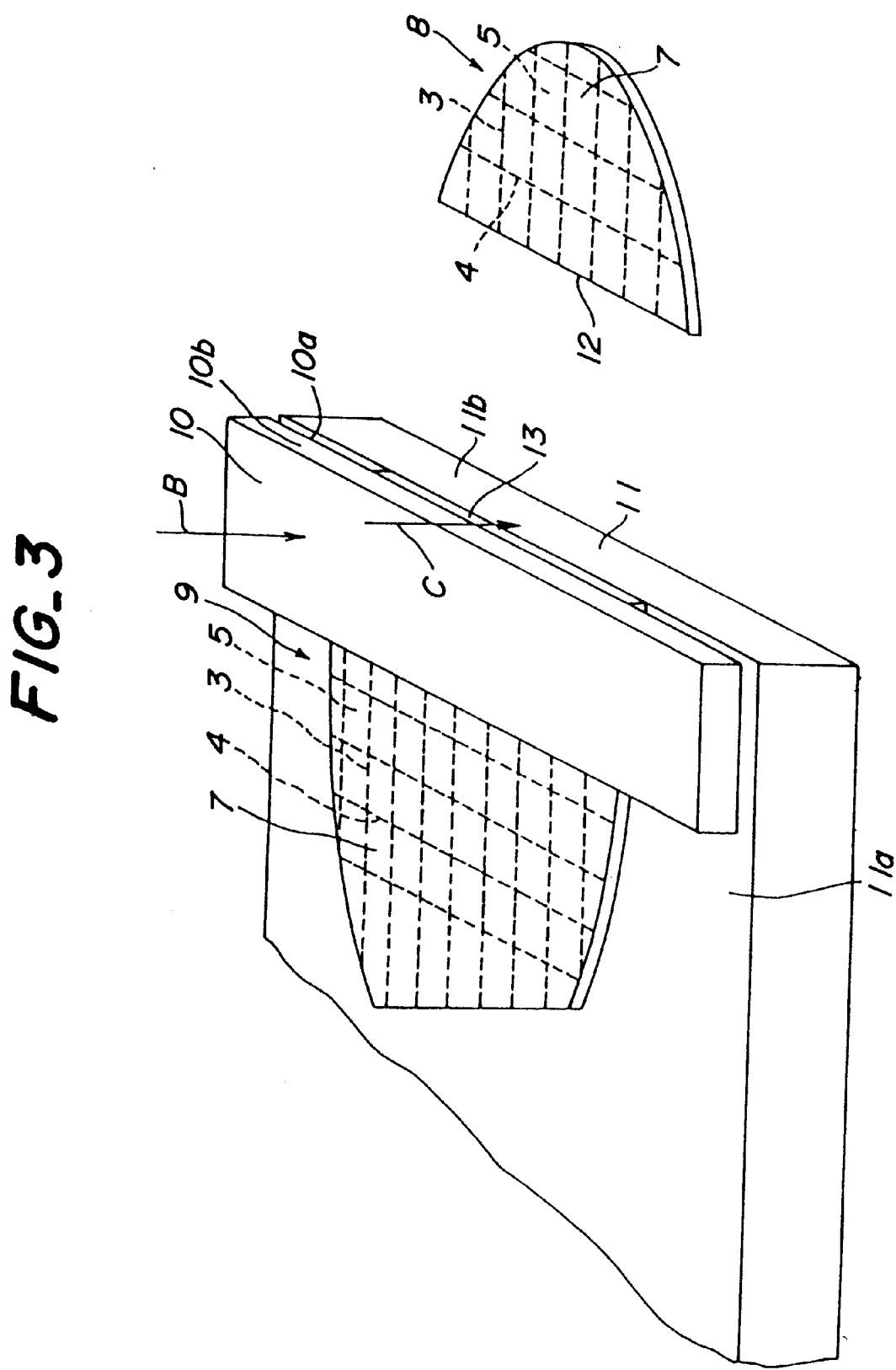
FIG. 3 is a perspective view for schematically illustrating a step in which the wafer in FIG. 2 is being cleaved.

FIGS. 1 to FIG. 3 illustrate one embodiment for carrying out the invention process. In a perspective view of FIG. 1, functional devices not shown are formed on a front surface 1a of a wafer 1 made of an oxide single crystal. The functional device means a device that utilizes a peculiar function of the oxide single crystal. More particularly, the functional devices may be applied as various optical devices such as the piezoelectric oscillator, the SAW filter, the optical waveguide substrate and the second harmonic generating element.

As shown by an arrow A, an adhesive tape 2 is adhered to a rear surface 1b of the wafer 1, and the wafer 1 is fixed on a working stage. Then, as shown in FIG. 1(b) by an arrow 6, a laser beam is irradiated upon the front surface 1a of the wafer 1, thereby forming the above-mentioned grooves. This adhesive tape is to prevent cut pieces from being scattered after the preform is cleaved, and the cut pieces are peeled off from the adhesive tape after the completion of the cleavage step.

In the present embodiment, the functional devices not shown are formed on the front surface 1a of the wafer 1 in a grid pattern. Thus, the laser beam 6 is irradiated and scanned over the surfaces 1a of the wafer 1 lengthwise and crosswise, thereby forming the grooves 3 and 4 in a grid pattern. The grooves 3 lie at right angles to the grooves 4, and given functional devices not shown are formed within respective squares 5 defined by the grooves 3, 4.

Next, as shown in FIG. 2, a resist film is formed on the front surface 1a of the wafer 1 by coating it with a resist film 7. Then, as shown in FIG. 3, the wafer 1 is cleaved.

More specifically, the wafer 1 is placed on a fixing face 11a of a fixing stage 11 in such a state that the front surface 1a of the wafer 1 is directed upwardly. A pressing surface 10a of the fixing jig 10 is contacted with the resist film 7 on the wafer 1. At that time, the location of the groove 4 along which the wafer 1 is to be cleaved is aligned with an edge of an end face 11b of the fixing table 11, whereas an edge of an end face of the fixing jig 10 is aligned with this groove 4. Pressure is applied to the fixing jig 10 as shown by an arrow B so that the wafer 1 may not be moved. Then, a load is applied upon a portion of the wafer 1 projecting outwardly beyond the groove 4 as shown by an arrow C.

As a result, the wafer 1 is cleaved along the groove 4, and divided into a cut pieces 8 and 9. Reference numerals 12 and 13 denote cleaved surfaces of the cut pieces, respectively.

EXAMPLES AND COMPARATIVE EXAMPLES

In the following, more specific experimental results will be explained.

Example 1

An X-cut wafer having a diameter of 3 inches and a thickness of 0.5 mm ($LiNbO_3$ single crystal) was prepared. Mach-Zehnder type optical waveguides and control electrodes were formed on a front surface 1a of the wafer 1 by a titanium diffusion process or a photolithography process, respectively. Thereby, sixteen travelling optical modulators were formed on the wafer 1. After an adhesive film 2 was bonded to a rear surface 1b of the wafer, the resulting wafer 1 was mechanically fixed directly to the working stage.

Grooves 3 and 4 were formed on the wafer in the spot scanning system with exposure to a fourth harmonic waves (wavelength: 266 nm) of a pulsed Nd-YAG laser. The scanning speed of the laser beam was set at 0.5 mm/sec. and the pulse-repeating frequency and the pulse width were 2 kHz and 45 nsec., respectively so that the output of the laser beam at the surface of the wafer 1 might be 300 mW. The grooves 3 and 4 each having a depth of 100 $\mu$m and a width of 40 $\mu$m were formed by this working.

A resist film 7 was coated onto the front surface 1a of the wafer 1, and as shown in FIG. 3, the resulting wafer 1 was fixed onto the fixing stage 11. Then, the wafer was cleaved by applying a force with hand as shown by an arrow C. By repeating this cleaving operation, 16 cut pieces were obtained. Then, each of the sixteen cut pieces was peeled from the adhesive film 2.

Example 2

An Z-cut wafer having a diameter of 3 inches and a thickness of 0.5 mm ($LiTaO_3$ single crystal) was prepared. The surface 1a of the wafer 1 was formed with 300 optical waveguides for second harmonic generation elements (SHG elements) by the photolithography process. After an adhesive film 2 was bonded to a rear surface 1b of the wafer, the resulting wafer 1 was mechanically fixed directly to the working stage.

Grooves 3 and 4 were formed on the wafer in the spot scanning system with exposure to an ArF Excimer laser (wavelength: 193 nm). The scanning speed of the laser beam was set at 0.3 mm/sec. and the pulse-repeating frequency and the pulse width were 2.5 kHz and 30 nsec., respectively, so that the output of the laser beam at the surface of the wafer 1 might be 200 mW. The grooves 3 and 4 each having a depth of 80 $\mu$m and a width of 40 $\mu$m were formed by this working.

A resist film 7 was coated onto the front surface 1a of the wafer 1, and as shown in FIG. 3, the resulting wafer 1 was fixed onto the fixing stage 11. Then, the wafer was cleaved by applying a force with hand as shown by an arrow C. By repeating this cleaving operation, 300 cut pieces were obtained. Then, each f the 300 cut pieces was peeled from the adhesive film 2.

Comparative Example 1

An Z-cut wafer having a diameter of 3 inches and a thickness of 0.5 mm ($LiTaO_3$ single crystal) was prepared. The surface 1a of the wafer 1 was formed with 300 optical waveguides for second harmonic generation elements (SHG elements) by the photolithography process.

After the front surface 1a of the wafer 1 was coated with a photoresist, an adhesive film 2 was bonded to a rear surface 1b of the wafer, and the resulting wafer 1 was mechanically fixed directly to the working stage with a vacuum chuck.

The wafer 1 was cut with a grinding stone made of #400 diamond grinding grains, a resinoid or a metal bond having a thickness of 0.3 mm by using a #400 grit size diamond blade having a thickness of 0.3 mm at a rotating speed of 20000 rpm and a feed speed of 100 mm/min of the blade. During the cutting step, cooling water needed to be continuously splashed over the wafer 1.

The cut pieces each having the second harmonic generation element were peeled off from the adhesive film one by one. Then, the photoresist on the surface of each of the cut pieces was dissolved off with acetone. Thereafter, the cut pieces needed to be subjected to IPA ultrasonic washing, pure water washing and drying with nitrogen gas flown over the cut pieces. Finally, 218 second harmonic generation elements were obtained.

Comparative Example 2

An X-cut wafer having a diameter of 3 inches and a thickness of 0,5 mm ($LiNbO_3$ single crystal) was prepared. Mach-Zehnder type optical waveguides and control electrodes were formed on a front surface 1a of the wafer 1 by the titanium diffusion process or the photolithography process, respectively. Thereby, 16 travelling optical modulators were formed on the wafer 1. After an adhesive film 2 was bonded to a rear surface 1b of the wafer, the resulting wafer 1 was mechanically fixed directly to the working stage.

Cleaving grooves were attempted to be formed on the wafer 1 with exposure to pulsed $CO_2$ laser (wavelength: 10600 nm). The scanning speed of the laser beam was set at 0,5 mm/sec. and the pulse-repeating frequency and the pulse width were 2 kHz and 45 nsec., respectively so that the output of the laser beam at the surface of the wafer 1 might be 300 W. The grooves each having a depth of 200 μm and a width of 300 μm were formed by this working.

However, innumerable fine cracks were formed in the wafer. In addition, since the control electrodes formed on the wafer were broken by heat resulting from the irradiation with the laser, perfect Mach-Zender type optical modulators could not be obtained.

Example 3

A single crystal film of aluminum nitride was epitaxially grown on an R-cut wafer made of $\alpha$-$Al_2O_3$ single crystal having a thickness of 0.4 mm by MOCVD process. A surface of the wafer was polished, and a film of aluminum was formed on the surface in a thickness of 50 nm, and a comb-shaped electrode was formed thereon by photolithography process. Thereby, 982 RF-SAW filter elements were formed.

A resist film was coated on the surface 1a of this wafer 1, and an adhesive film 2 was bonded to the rear surface 1b of the wafer 1, and the resulting wafer was mechanically fixed to the working stage.

Grooves were formed on the wafer through exposure by the spot scanning system using fourth harmonic waves (wavelength: 266 nm) of a Q switch pulse Nd-YAG laser. More specifically, a spot size of the beam on the surface of the wafer was 20 μm in diameter, and the scanning speed on the working stage was set at 0,5 mm/sec. and the pulse-repeating frequency and the pulse width were set at 3 kHz and 45 nsec, respectively so that the output of the laser beam might be 350 mW. By this working, the grooves each having a depth of 200 μm and a width of 20 μm were formed.

The wafer was fixed on the cleaving stage, and cleaved by using an appropriate jig. By repeating this cleavage, 965 cut pieces were obtained. From the adhesive film were peeled off 965 cut pieces, and the resist film was dissolved off from the surface of each of the cut piece by washing it with acetone.

Comparative Example 3

A single crystal film of aluminum nitride was epitaxially grown on an R-cut wafer made of $\alpha$-$Al_2O_3$ single crystal having a thickness of 0.45 mm by MOCVD process. A surface of the wafer was polished, and a film of aluminum was formed on the surface in a thickness of 50 nm, and a comb-shaped electrode was formed thereon by photolithography process. Thereby, 982 RF-SAW filter elements were formed.

A resist film was coated on the surface 1a of this wafer 1, and an adhesive film 2 was bonded to the rear surface 1b of the wafer 1, and the resulting wafer was mechanically fixed to the working stage with the vacuum chuck.

The RF-SAW filter elements were cut out by cutting the wafer in this state. More specifically, a #400 grit size diamond blade having a thickness of 0.2 mm was used. The rotating speed and the feed speed of the blade were set at 30,000 rpm and 4 mm/sec. respectively. A groove having a depth of about 0.25 mm was formed on the wafer by once feeding the blade, and the remainder was cut off by secondarily feeding the blade. During cutting, cooling water needed to be continuously splashed over the wafer 1. By this cutting, 836 cut pieces were obtained. From the adhesive film were peeled off 836 cut pieces one by one. Then, the surface of each of the cut pieces was washed with acetone, thereby dissolving off the resist film on the surface of each of the cut pieces.

Example 4

A film of a GaN-based single crystal was epitaxially grown on an Z-cut 2-inch wafer made of $\alpha$-$Al_2O_3$ single crystal having a thickness of 0.3 mm by MOCVD process, and a film of an electrode pattern was formed on the surface of the resulting wafer by photolithography process. Thereby, 3,658 light-emitting diodes were formed on the surface of the wafer. An adhesive film was bonded to the surface of the wafer, and the resulting wafer was mechanically fixed to the working stage.

Grooves were formed on the rear surface of the wafer through exposure by the spot scanning system using fourth harmonic waves (wavelength: 266 nm) of a Q switch pulse Nd-YAG laser. More specifically, a spot size of the beam on the rear surface of the wafer was 20 μm in diameter, and the scanning speed on the working stage was set at 1.0 mm/sec. and the pulse-repeating frequency and the pulse width were set at 3 kHz and 45 nsec, respectively so that the output of the laser beam might be 350 mW. By this working, the grooves each having a depth of 100 μm and a width of 20 μm were formed.

The wafer was fixed on the cleaving stage, and cleaved by an appropriate jig. By repeating this cleavage, 3,262 cut pieces were obtained. From the adhesive film were peeled off 3,262 cut pieces.

Comparative Example 4

A film of a GaN-based single crystal was epitaxially grown on an Z-cut 2-inch wafer made of $\alpha$-$Al_2O_3$ single crystal having a thickness of 0.3 mm by MOCVD process, and a film of an electrode pattern was formed on the surface of the resulting wafer by photolithography process. Thereby, 3,658 light-emitting diodes were formed on the surface of the wafer. The resulting wafer was mechanically fixed to the working stage.

Grooves were formed on the front and rear surfaces of the wafer by scratching them with a diamond point cutter at a speed of 50 mm/sec. in the state that the cutter was pressed upon the wafer under a load of 50 gf. Each groove had a width of 50 μm and a depth of 2 μm. The wafer was fixed on the cleaving stage, and cleaved by an appropriate jig. By repeating this cleavage, 1,460 cut pieces were obtained.

As mentioned above, the present invention can provide a new dry process for dicing preforms made of oxide single crystals. Thereby, the preform can be diced at a high yield in a short working time at a low working cost.

What is claimed is:

1. A process for dicing a preform made of an oxide single crystal into cut pieces each having a given shape, said process consisting essentially of the steps of removing molecules of the oxide single crystal through dissociation and evaporation with an optochemical reaction under iation of a single-wavelength laser beam upon the preform, thereby forming grooves on the preform, said laser beam having a wavelength near that of an absorption edge of the oxide single crystal, and then cleaving the preform along the grooves.

2. The process set forth in claim 1, wherein the preform is a wafer.

3. The process set forth in claim 2, wherein functional devices are formed on the wafer on locations corresponding to the cut pieces, and the cut pieces provided with the functional devices, respectively, are obtained by cleaving the wafer.

4. The process set forth in claim 1, wherein the oxide single crystal is selected from the group consisting of a lithium niobate single crystal, a lithium tantalate single crystal, a single crystal of lithium niobate-lithium tantalate solid solution, a $K_3Li_2Nb_5O_{15}$ and an $La_3Ga_5SiO_{14}$ single crystal.

5. The process set forth in claim 1, wherein the oxide single crystal is an aluminum oxide single crystal.

6. The process set forth in claim 1, wherein a difference in wavelength between the absorption edge of the oxide single crystal and the laser beam is not more than 100 nm.

7. The process set forth in claim 1, wherein the laser beam is a laser beam selected from the group consisting of an Excimer laser and a fourth harmonic Nd-YAG laser.

8. The process set forth in claim 1, wherein the laser beam is scanned over the preform by spot scanning, batch transferring or slit scanning.

9. The process set forth in claim 1, wherein an adhesive film is adhered to a rear face of the preform, the grooves are formed on a front face of the preform, and the cut pieces are peeled off from the adhesive film after the cleavage.

10. The process set forth in claim 1, wherein said laser beam has a wavelength of 200–300 nm.

11. The process set forth in claim 10, wherein said laser beam has a wavelength that is ±100 nm the wavelength of the absorption edge of the oxide single crystal.

12. A process for producing functional devices provided on cut pieces each made of an oxide single crystal and having a given shape, said process consisting essentially of the steps of forming the functional devices on a wafer at positions corresponding to locations of the cut pieces, removing molecules of the oxide single crystal through dissociation and evaporation with an optochemical reaction under irradiation of a single-wavelength laser beam upon the wafer, thereby forming such grooves in the wafer as to surround the respective functional devices, said laser beam having a wavelength near that of an absorption edge of the oxide single crystal and then cleaving, the wafer along the grooves.

13. The process set forth in claim 12, wherein the functional devices are optical devices selected from the group consisting of piezoelectric oscillators, SAW filters, optical waveguide substrates and second harmonic generation elements.

14. The process set forth in claim 12, wherein said laser beam has a wavelength of 200–300 nm.

15. The process set forth in claim 1, wherein said laser beam has a wavelength that is ±100 nm the wavelength of the absorption edge of the oxide single crystal.

* * * * *